United States Patent
Inokuchi

(10) Patent No.: US 11,070,204 B2
(45) Date of Patent: Jul. 20, 2021

(54) DRIVER CIRCUIT CAPABLE OF DETECTING ABNORMALITY OF CAPACITIVE LOAD

(71) Applicant: ROHM CO., LTD., Kyoto (JP)

(72) Inventor: Hiroyuki Inokuchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/661,233

(22) Filed: Oct. 23, 2019

(65) Prior Publication Data

US 2020/0136613 A1 Apr. 30, 2020

(30) Foreign Application Priority Data

Oct. 24, 2018 (JP) .............................. JP2018-200336

(51) Int. Cl.
| | | |
|---|---|---|
| *H03K 17/94* | (2006.01) | |
| *G09G 3/20* | (2006.01) | |
| *G01R 27/26* | (2006.01) | |
| *B41J 2/045* | (2006.01) | |
| *G01R 31/01* | (2020.01) | |

(52) U.S. Cl.
CPC .......... *H03K 17/94* (2013.01); *B41J 2/04541* (2013.01); *B41J 2/04586* (2013.01); *G01R 27/2605* (2013.01); *G01R 31/016* (2013.01); *G09G 3/20* (2013.01); *G09G 2310/0267* (2013.01); *G09G 2310/0275* (2013.01); *G09G 2320/043* (2013.01); *G09G 2330/12* (2013.01)

(58) Field of Classification Search
CPC .................. H03K 17/94; H03K 17/955; B41J 2/04503–04508; B41J 2/04541; B41J 2/0457; B41J 2/04573; B41J 2/04586; G01R 27/26; G01R 27/2605; G01R 31/016; G01R 31/088; G01R 31/11; G06F 3/0412; G06F 3/044; G06F 3/0445; G06F 3/0448; G06F 3/047; G09G 3/36; G09G 3/3648; G09G 3/3674–3696; G09G 2310/0264; G09G 2310/0267; G09G 2310/0275; G09G 2310/0286; G09G 2310/0291; G09G 2310/0297; G09G 2320/04; G09G 2320/043; G09G 2320/0693; G09G 2330/08–12

See application file for complete search history.

(56) References Cited

U.S. PATENT DOCUMENTS

| | | | | |
|---|---|---|---|---|
| 6,168,252 | B1 * | 1/2001 | Yaji | B41J 2/0454 201/1 |
| 10,097,742 | B1 * | 10/2018 | Moon | G02F 1/29 |
| 2003/0151587 | A1 * | 8/2003 | Yamashita | G09G 3/006 345/102 |

(Continued)

*Primary Examiner* — Nathan Danielsen
(74) *Attorney, Agent, or Firm* — Cantor Colburn LLP

(57) ABSTRACT

A driver circuit driving a plurality of capacitive loads includes: a plurality of output terminals to which the plurality of capacitive loads are to be connected; a plurality of drivers corresponding to the plurality of output terminals, each of the plurality of drivers being configured to generate a drive signal to be applied to each of the plurality of capacitive loads respectively corresponding to the plurality of drivers; and a capacitance detection circuit configured to detect a capacitance associated with each of the plurality of output terminals.

12 Claims, 13 Drawing Sheets

(56) References Cited

U.S. PATENT DOCUMENTS

| | | | |
|---|---|---|---|
| 2008/0088648 A1* | 4/2008 | Nathan | G09G 3/3283 |
| | | | 345/690 |
| 2009/0201242 A1* | 8/2009 | Govil | G09G 3/346 |
| | | | 345/98 |
| 2014/0197845 A1* | 7/2014 | Ko | G06F 3/044 |
| | | | 324/537 |
| 2017/0138997 A1* | 5/2017 | Wuerstlein | H03K 17/955 |
| 2018/0370227 A1* | 12/2018 | Hayashi | B41J 2/04581 |

* cited by examiner

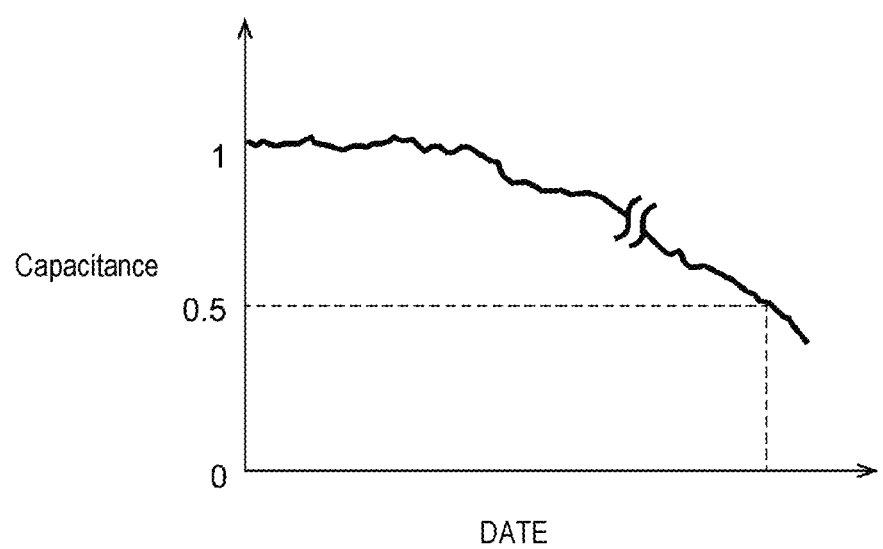

DRIVER CIRCUIT CAPABLE OF DETECTING ABNORMALITY OF CAPACITIVE LOAD

CROSS-REFERENCE TO RELATED APPLICATION

The present invention claims priority under 35 U.S.C. § 119 to Japanese Patent Application No. 2018-200336, filed on Oct. 24, 2018, the entire contents of which are incorporated herein by reference.

TECHNICAL FIELD

The present disclosure relates to a technique for driving a capacitive load.

BACKGROUND

A driver circuit having output terminals of several tens, hundreds, or thousands of channels is used for various applications. Examples of such driver circuit may include a gate driver and a source driver of a liquid crystal display panel, a one-chip driver in which the gate driver and the source driver are integrated, a printer driver having an array of piezo elements, and the like. The driver circuit includes a plurality of output terminals (output pins) and is configured to be able to individually control the electrical states of loads connected respectively to the output terminals.

FIG. 1 is a block diagram of a display system 100. The display system 100 includes a panel 110, a gate driver 120, and a source driver 130. The panel 110 includes a plurality of N source lines SL, a plurality of M gate lines GL, and a plurality of pixels 112 arranged in the form of a matrix at intersections of the plurality of gate lines GL and the plurality of source lines SL. Each pixel 112 includes a TFT (Thin Film Transistor). The gate of the TFT is connected to a gate line GL, and the source of the TFT is connected to a source line SL.

The gate driver 120 selects a plurality of gate lines $GL_1$, $GL_2$, . . . , by sequentially applying a high level gate drive voltage $V_G$ to the gate lines, and activates a TFT connected to a selected gate line GL. The source driver 130 applies a source drive voltage $V_S$ corresponding to a luminance to the source lines SL to set the luminance of the pixels 112 corresponding to the respective source lines SL.

As a result of studying the display system 100 of FIG. 1, the present inventors came to recognize the following problems. FIG. 2A to FIG. 2C are waveform diagrams of source drive voltages $V_S$ generated by the source driver 130. FIG. 2A shows a normal source drive voltage $V_S$. FIG. 2B and FIG. 2C show source drive voltages $V_S$ when an abnormality occurs. In FIG. 2B, the waveform is dull compared to that in FIG. 2A. In this case, an error in luminance between pixels becomes large (discoloration). In FIG. 2C, ringing occurs in the source drive voltage $V_S$. In this case, noise is generated.

FIG. 3A to FIG. 3C are waveform diagrams of gate drive voltages $V_G$ generated by the gate driver 120. FIG. 3A shows a normal gate source drive voltage $V_G$. FIG. 3B and FIG. 3C show gate drive voltages $V_G$ when an abnormality occurs. In FIG. 3B, the waveform is dull compared to that in FIG. 3A. In this case, the TFT activation time is insufficient and correct luminance cannot be set. In FIG. 3C, ringing occurs in the gate drive voltage $V_G$. In this case, noise is generated.

Abnormalities such as those shown in FIG. 2B and FIG. 2C or FIG. 3B and FIG. 3C occur due to defective manufacturing or aging deterioration of the panel 110.

SUMMARY

Some embodiments of the present disclosure provide a driver circuit capable of detecting an abnormality of a load.

According to an aspect of the present disclosure, a driver circuit that drives a plurality of capacitive loads is provided. The driver circuit includes: a plurality of output terminals to which the plurality of capacitive loads are to be connected; a plurality of drivers corresponding to the plurality of output terminals, each of the plurality of drivers being configured to generate a drive signal to be applied to each of the plurality of capacitive loads respectively corresponding to the plurality of drivers; and a capacitance detection circuit configured to detect a capacitance associated with each of the plurality of output terminals.

As a result of studying a failure mode and a deterioration mode of a capacitive load, the present inventor came to recognize that the cause was a change in capacitance of the capacitive load. According to this aspect, it is possible to detect an abnormality or deterioration of the capacitive load by detecting the capacitance associated with each output terminal (that is, the load capacitance visible from the output terminal) by the capacitance detection circuit.

In some embodiments, the capacitance detection circuit may include an electrostatic capacitance sensor and a selector configured to connect the capacitance sensor to one of a plurality of output terminals according to a control signal. According to this aspect, one capacitance sensor may be shared by the plurality of output terminals, thereby suppressing an increase in circuit area.

In some embodiments, the driver circuit may further include a signal processing part configured to detect an abnormality based on a capacitance associated with each of the plurality of output terminals.

In some embodiments, the signal processing part may monitor an aging change of the capacitance associated with each of the plurality of output terminals. Thereby, it is possible to detect aging deterioration of the capacitive load.

In some embodiments, a driving capability of the drivers is adjustable according to the aging change of the capacitance associated with each of the plurality of output terminals. Thereby, it is possible to improve the waveform.

In some embodiments, a degree of deterioration or an abnormality may be detected based on the aging change of the capacitance associated with each of the plurality of output terminals.

In some embodiments, the signal processing part may detect an abnormality based on the capacitance associated with each of the plurality of output terminals.

In some embodiments, an abnormality may be detected based on a relationship between the capacitances respectively associated with adjacent output terminals.

In some embodiments, the driver circuit may be configured to be capable of notifying a degree of deterioration or an abnormality to an outside of the driver circuit.

In some embodiments, the driver circuit may drive a matrix type display panel. The driver circuit may be a gate driver, a source driver, or a one-chip driver in which the gate driver and the source driver are integrated.

In some embodiments, the driver circuit may drive a plurality of piezo elements.

Any combinations of the above-described elements or changes of the representations of the present disclosure between methods, apparatuses and systems are effective as embodiments of the present disclosure.

BRIEF DESCRIPTION OF DRAWINGS

FIG. 7 is a graph showing an aging change of a capacitance Cs.

DETAILED DESCRIPTION

Figure 1:
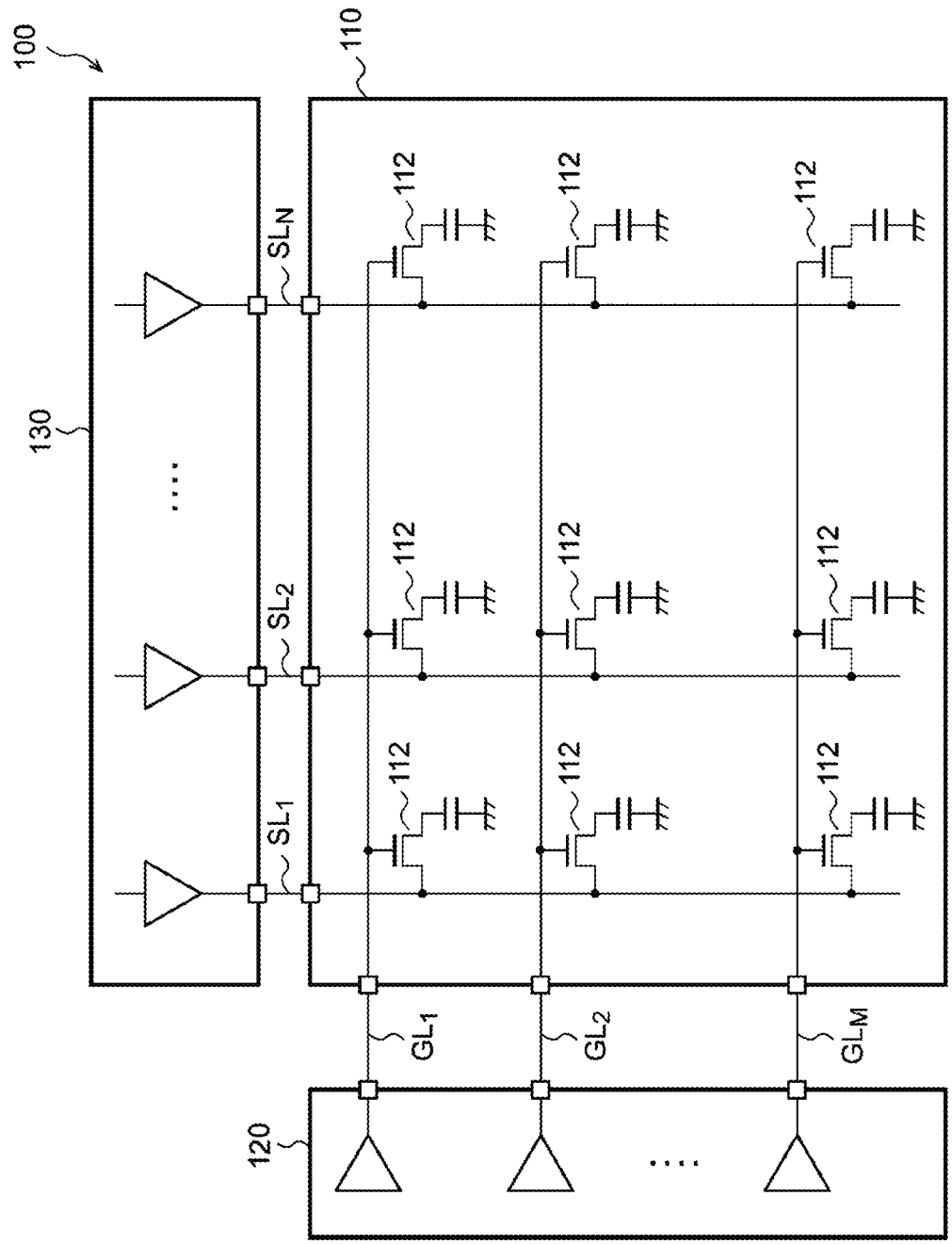
FIG. 1 is a block diagram of a display system.
Figure 2A:
FIG. 2A to FIG. 2C are waveform diagrams of a source drive voltage $V_S$ generated by a source driver.
Figure 2B:
Figure 2C:
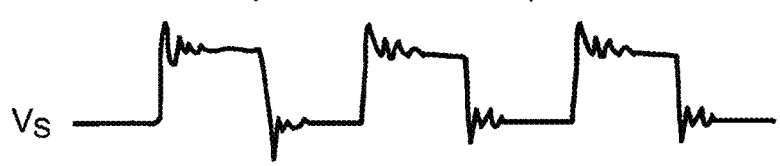
Figure 3A:
FIG. 3A to FIG. 3C are waveform diagrams of a gate drive voltage $V_G$ generated by a gate driver.
Figure 3B:
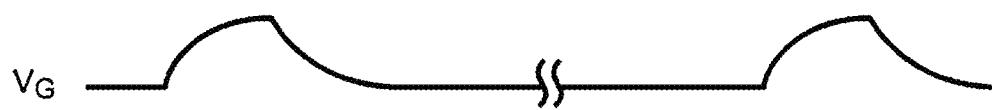
Figure 3C:
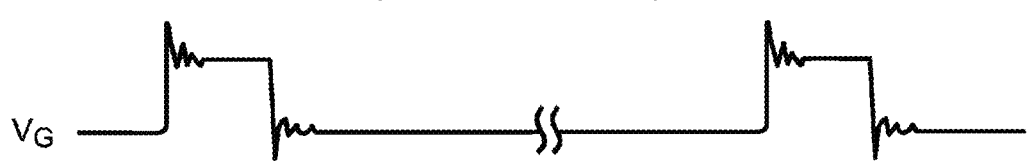

Embodiments of the present disclosure will be now described in detail with reference to the drawings. Like or equivalent components, members, and processes illustrated in each drawing are given like reference numerals, and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through other member that does not affect an electrical connection state between the members A and B. Similarly, "a state where a member C is installed between a member A and a member B" includes a case where the member A and the member C or the member B and the member C are indirectly connected through other member that does not affect an electrical connection state between the members A and C or the members B and C, in addition to a case where the member A and the member C or the member B and the member C are directly connected.

Figure 4:
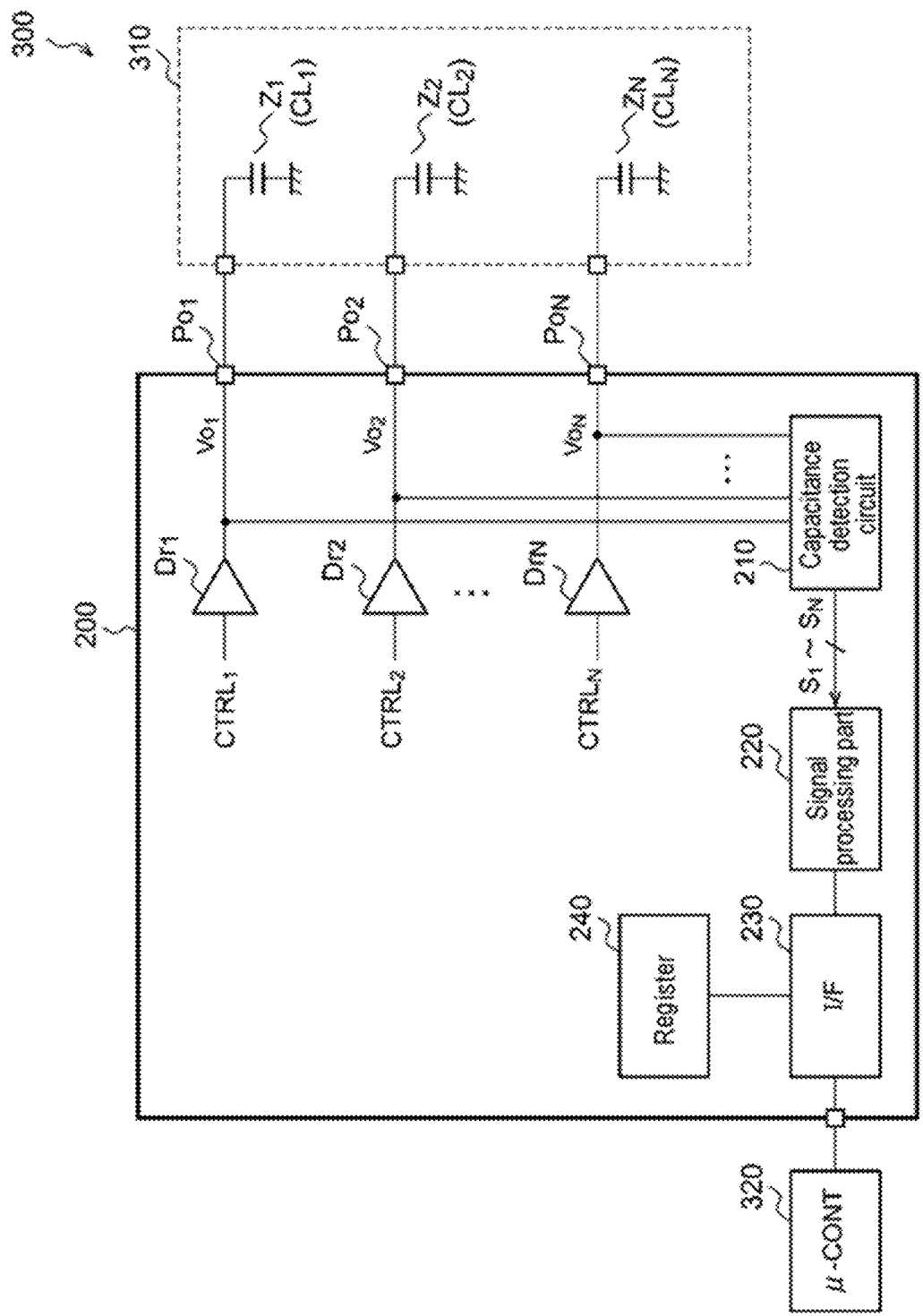
FIG. 4 is a circuit diagram of a driver circuit according to an embodiment of the present disclosure.

FIG. 4 is a circuit diagram of a driver circuit 200 according to an embodiment of the present disclosure. The driver circuit 200 is configured with N channels having a plurality of N outputs, and is configured to be able to drive a plurality of N capacitive load elements (hereinafter simply referred to as load elements) $Z_1$ to $Z_N$. The driver circuit 200 includes a plurality of output terminals $Po_1$ to $Po_N$, a plurality of drivers $Dr_1$ to $Dr_N$, a capacitance detection circuit 210, a signal processing part 220, and an interface circuit 230, and is a functional IC (Integrated Circuit) integrated on a single semiconductor substrate.

The driver circuit 200 constitutes a system 300 together with a load circuit 310 and a host processor 320. The host processor 320 can generally control the entire system 300, and is constituted by, for example, a microcontroller.

The load circuit 310 includes the plurality of N load elements $Z_1$ to $Z_N$. In FIG. 4, a load element Z is indicated by a capacitor symbol. However, the capacitor symbol does not limit a type of the load element Z, but it merely shows an equivalent capacitance component CL when the load element Z is viewed from an output terminal $P_O$. For example, the load element Z is a transistor, a piezo element, a light emitting diode (LED), a thermal head, or the like.

The load elements $Z_1$ to $Z_N$ are connected to the output terminals $Po_1$ to $Po_N$, respectively. The drivers $Dr_1$ to $Dr_N$ correspond to the output terminals $Po_1$ to $Po_N$, respectively. The output of the driver $Dr_\#$ (#=1 to N) is connected to the corresponding load element $Z_\#$ via the corresponding output terminal $Po_\#$. In response to a control signal $CTRL_\#$, the driver $Dr_\#$ generates a drive voltage $Vo_\#$ to be applied to the corresponding capacitive load element $Z_\#$ and outputs it from the output terminal $Po_\#$. Control signals $CTRL_1$ to $CTRL_N$ may be generated within the driver circuit 200 or may be provided from outside the driver circuit 200.

The capacitance detection circuit 210 can be switched between on and off, and generates detection signals $Ds_1$ to $Ds_N$ indicating electrostatic capacitances (simply referred to as capacitances) $Cs_1$ to $Cs_N$ associated with the output terminals $Po_1$ to $Po_\#$, respectively, in the on state. The capacitance detection circuit 210 is scheduled to be turned off during a normal operation in which the driver circuit 200 drives the load elements $Z_1$ to $Z_N$, and automatically turned on during the operation other than the normal operation, for example, immediately after the driver circuit 200 is started. Alternatively, the driver circuit 200 may be turned on in response to a command from an external microcontroller. During capacitance measurement by the capacitance detection circuit 210, the outputs of the drivers $Dr_1$ to $Dr_N$ are set to a high impedance state.

In the present embodiment, the detection signals $Ds_1$ to $Ds_N$ are digital signals. The signal processing part 220 performs digital signal processing on the detection signals $Ds_1$ to $Ds_N$, and detects an abnormality or aging change (deterioration) of the load circuit 310.

The interface circuit 230 is configured to be able to exchange data and control signals with the host processor 320. The interface circuit 230 may employ, for example, an I²C (Inter IC) interface or an SPI (Serial Peripheral Interface). For example, the interface circuit 230 is connected to a register 240, and the host processor 320 may read or write necessary data by designating an address and accessing the register.

The above is a configuration of the driver circuit 200 and the system 300 including the driver circuit 200. Next, the operation of the driver circuit 200 will be described.

As a result of studying the conventional driver circuit, the present inventors came to recognize that disturbance of the waveform of the output signal (drive voltage) of the driver circuit shown in FIG. 2A to FIG. 2C and FIG. 3A to FIG. 3C is based on an unintended parasitic capacitance included in the load circuit 310. It should be noted that this recognition is not a general recognition of those skilled in the art at the time of the present disclosure.

Figure 5A:
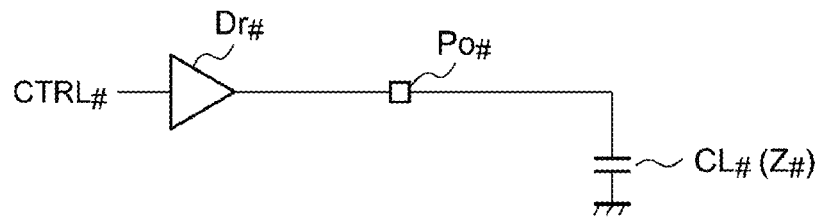
FIG. 5A is an equivalent circuit diagram of a portion of the system that does not contain an unintended parasitic capacitance.
Figure 5B:
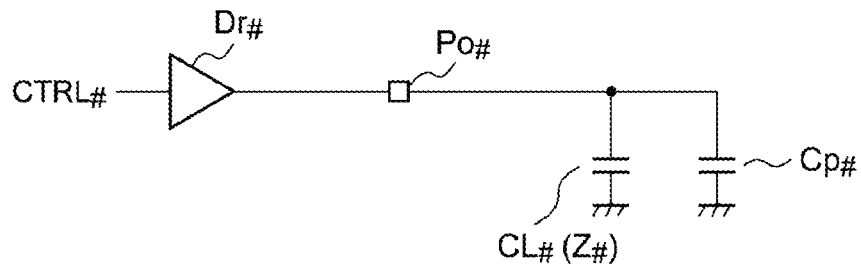
FIG. 5B to FIG. 5D are equivalent circuit diagrams of portions of the system that contain an unintended parasitic capacitance.
Figure 5C:
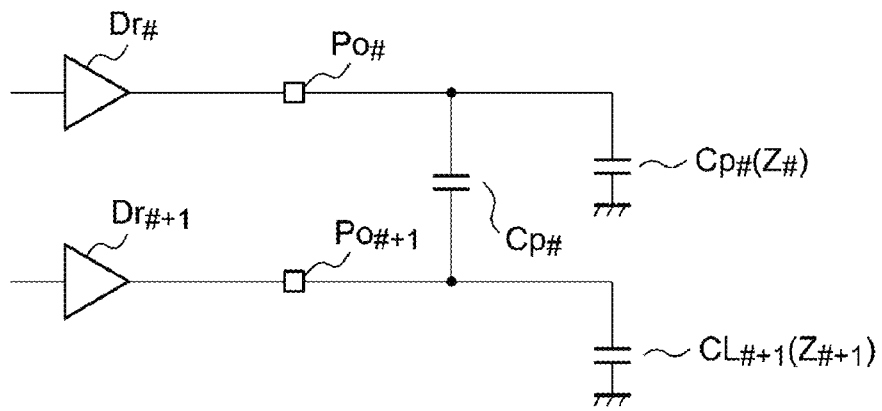
Figure 5D:
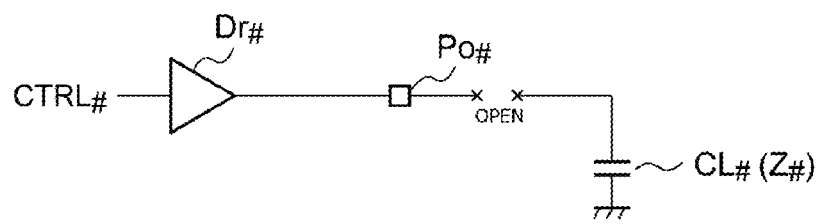

FIG. 5A is an equivalent circuit diagram of a portion of the system 300 that does not include an unintended parasitic capacitance, and FIG. 5B to FIG. 5D are equivalent circuit diagrams of portions of the system 300 that include an unintended parasitic capacitance.

In FIG. 5B, an unintended parasitic capacitance Cp is introduced in parallel with the load element $Z_\#$, which is hereinafter referred to as a first abnormal mode.

In FIG. 5C, an unintended parasitic capacitance Cp is introduced between the load elements $Z_\#$ and $Z_{\#+1}$ of two adjacent channels, which is hereinafter referred to as a second abnormal mode. The second abnormal mode is understood as an AC short circuit.

Furthermore, the present inventors have recognized that the capacitance CL of the load element Z may be smaller than that of an initial design according to an aging change in the load circuit 310, which is referred to as a third abnormal mode.

FIG. 5D shows an open abnormality in which a wiring is disconnected. When the open abnormality occurs, the capacitance on the load $Z_\#$ side viewed from the output terminal $Po_\#$ becomes small (a fourth abnormal mode). The open abnormality may occur due to an initial failure in the manufacturing stage, or may gradually become apparent due to the aging deterioration. The open abnormality may also be understood as an aspect of fluctuation of the capacitance and causes a waveform disturbance of the output voltage Vo.

Figure 6A:
FIG. 6A to FIG. 6C are waveform diagrams of an output voltage Vo when first to third abnormal modes occur.
Figure 6B:
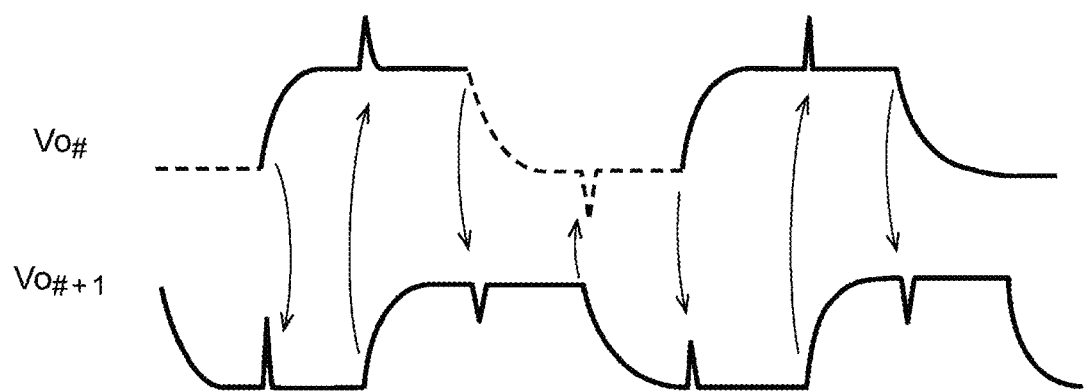
Figure 6C:

FIG. 6A to FIG. 6C are waveform diagrams of the output voltage Vo when the first to third abnormal modes occur. For comparison, a waveform at normal is indicated by a broken line.

Referring to FIG. 6A, a driving capability of the driver Dr is optimized in a state where there is no parasitic capacitance. In the first abnormal mode, since the load (capacitance) of the driver $Dr_\#$ is larger than that at normal, the waveform of the output voltage $Vo_\#$ is rounded.

Referring to FIG. 6B, in the second abnormal mode, two adjacent channels are coupled by the parasitic capacitance Cp, and the high frequency component of the output voltage Vo of one channel is superimposed as spike noise on the output voltage Vo of the other channel.

Referring to FIG. 6C, in the third abnormal mode, since the load (capacitance) of the driver $Dr_\#$ is smaller than that at normal, driving capability of the driver $Dr_\#$ becomes excessive, and overshoot, undershoot, and subsequent ringing of the output voltage $Vo_\#$ occur.

In this way, the waveform disturbance of the output voltage Vo occurs due to the fluctuation of the capacitance. With the driver circuit 200 according to the embodiment, it is possible to preferably detect that some abnormality has occurred, by measuring the capacitance of each channel by the capacitance detection circuit 210.

In one embodiment, the signal processing part 220 monitors aging changes of the capacitances $Cs_1$ to $Cs_N$ of the output terminals $Po_1$ to $Po_N$. FIG. 7 is a graph showing an aging change of the capacitance Cs. In the graph, the horizontal axis represents time (date), and the vertical axis represents the average value (or typical value) of measured capacitance. The capacitance Cs is normalized with the initial value $C_{INIT}$ being 1. In this example, the capacitance Cs decreases with time. The signal processing part 220 may hold the history of the measured capacitance Cs in the register 240. Then, when a rate of change from the initial capacitance $C_{INIT}$ deviates from a reference range, an alert indicating aging deterioration may be generated. In this example, when the rate of change based on the initial capacitance $C_{INIT}$ is smaller than 0.5, an alert of abnormality is generated.

A notification of the alert is provided to the host processor 320 via the interface circuit 230. The host processor 320 may alert a user of the system 300 of the aging deterioration using a user interface (not shown). The user can take measures such as replacing the load circuit 310 in order to deal with the alert of the aging deterioration.

The signal processing part 220 may detect the degree of deterioration based on an aging change of the capacitance Cs and notify the host processor 320 of the degree of deterioration. The rate of change with respect to the initial capacitance may be used as the degree of deterioration, or the rate of change may be converted into the degree of deterioration using a predetermined arithmetic expression.

The drivers $Dr_1$ to $Dr_N$ are configured such that their driving capability can be adjusted according to the aging change of the measured capacitance Cs. The configuration for adjusting the driving capability is not particularly limited. For example, sizes of transistors in the output stage of the drivers $Dr_1$ to $Dr_N$ may be varied, or a bias current flowing through the drivers $Dr_1$ to $Dr_N$ may be varied.

The driving capability of the drivers $Dr_1$ to $Dr_N$ of all channels may be adjusted uniformly. Specifically, when the capacitance Cs decreases compared to the initial capacitance, it can be estimated that the above-described third abnormal mode has occurred.

In this case, the driving capability may be decreased depending on the degree of decrease of the capacitance. This can suppress the overshoot and undershoot as well as the subsequent ringing shown in FIG. 6C.

On the contrary, when the capacitance Cs increases compared to the initial capacitance, the driving capability may be increased depending on a degree of increase of the capacitance. This can suppress the waveform rounding shown in FIG. 6A.

In monitoring the aging changes, a maximum value or a minimum value of the capacitances $Cs_1$ to $Cs_N$ may be used instead of an average value of the capacitances $Cs_1$ to $Cs_N$. Alternatively, the capacitance $Cs_x$ of the predetermined channel $CH_x$ may be used as a representative value of the capacitance $Cs_1$ to $Cs_N$.

In a modification, a history of the capacitance Cs may be individually monitored for all channels, and the degree of deterioration may be monitored for each channel. In this case, the driving capability of the driver may be optimized for each channel.

In addition to or instead of the driving capability of the driver, the set value of the output (driving signal) of the drivers $Dr_1$ to $Dr_N$ may be adjusted according to the aging change of the measured capacitance Cs.

Figure 8A:
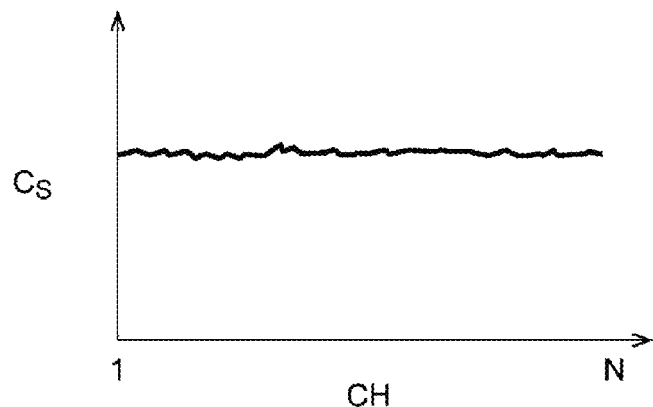
FIG. 8A to FIG. 8D are graphs showing capacitance distributions of a plurality of channels.

FIG. 8A to FIG. 8D are graphs showing capacitance distributions of a plurality of channels $CH_1$ to $CH_N$. In the graphs, the horizontal axis represents a channel number, and the vertical axis represents the capacitance Cs of each channel. FIG. 8A shows a capacitance distribution of the normal system 300, which is flat without dependence on a channel.

Figure 8B:
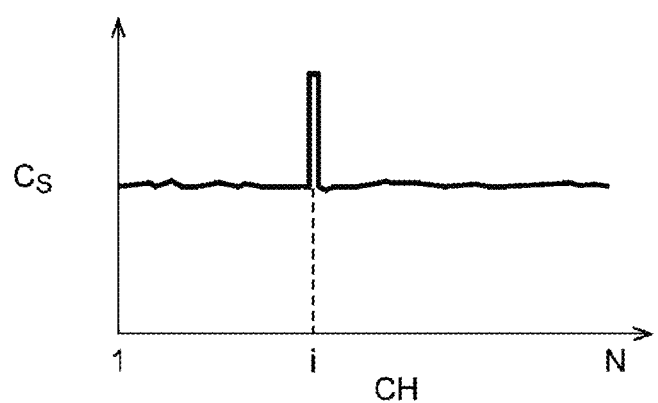

FIG. 8B shows the capacitance distribution of the system 300 in which the first abnormal mode occurs. As shown, a capacitance of the channel $Ch_{i,s}$ where a parasitic capacitance Cp exists is larger than that of the other channels $CH_j$ (where j≠i). Therefore, when the capacitance $Cs_i$ of a certain channel $CH_j$ is larger than the capacitances $Cs_{i-1}$ and $Cs_{i+1}$ of adjacent channels (or larger than an average value of the capacitances of some or all channels), it can be estimated that the first abnormal mode has occurred in the channel $CH_i$.

Figure 8C:
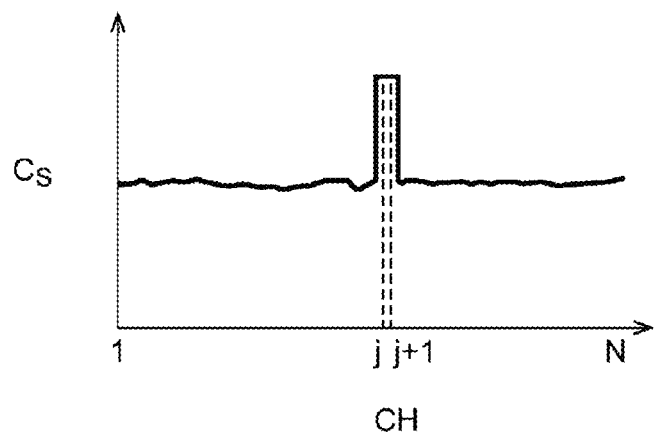

FIG. 8C shows the capacitance distribution of the system 300 in which the second abnormal mode occurs. As shown, the capacitances of the two adjacent channels $CH_j$ and $CH_{j+1}$ where the parasitic capacitance Cp exists are larger than that of the other channels. Therefore, when the capacitances $Cs_j$ and $Cs_{j+1}$ of the two adjacent channels are larger than the capacitances $Cs_{j-1}$ and $Cs_{j+2}$ of adjacent channels (or larger than the average value of the capacitances of some or all channels), it can be estimated that the second abnormal mode has occurred in the channels $CH_j$ and $CH_{j+1}$.

Figure 8D:
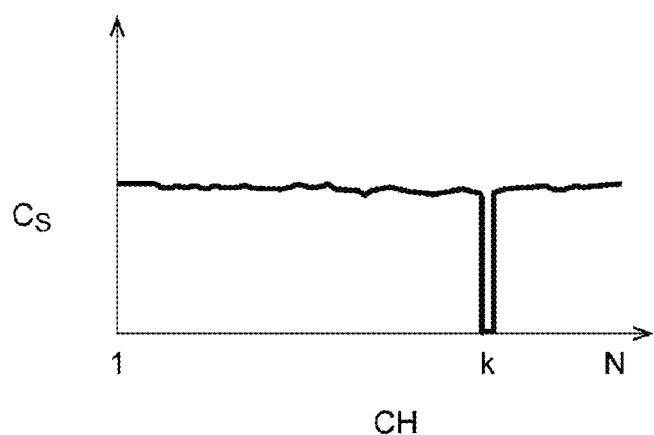

FIG. 8D shows a capacitance distribution of the system 300 in which an open abnormality occurs. When a wiring is disconnected in a channel $CH_k$, a capacitance $Cs_k$ of the channel $CH_k$ becomes very small. Therefore, when the capacitance $Cs_k$ of a certain channel $CH_k$ is larger than the capacitances $Cs_{k-1}$ and $Cs_{k+1}$ of adjacent channels (or larger than the average value of some or all channels), it can be estimated that an open abnormality has occurred in the channel $CH_k$.

In this way, by acquiring the capacitance distribution, it is possible to detect the first abnormality mode, the second abnormality mode, or the open abnormality based on the relative relationship among a plurality of capacitances.

Further, when the driver circuit 200 detects the abnormal mode, it notifies the host processor 320 accordingly. At this time, a channel number i (j, j+1 or k) of the channel in which the abnormality is detected may be transmitted together. The channel number is useful for failure analysis of the system 300.

Figure 9:
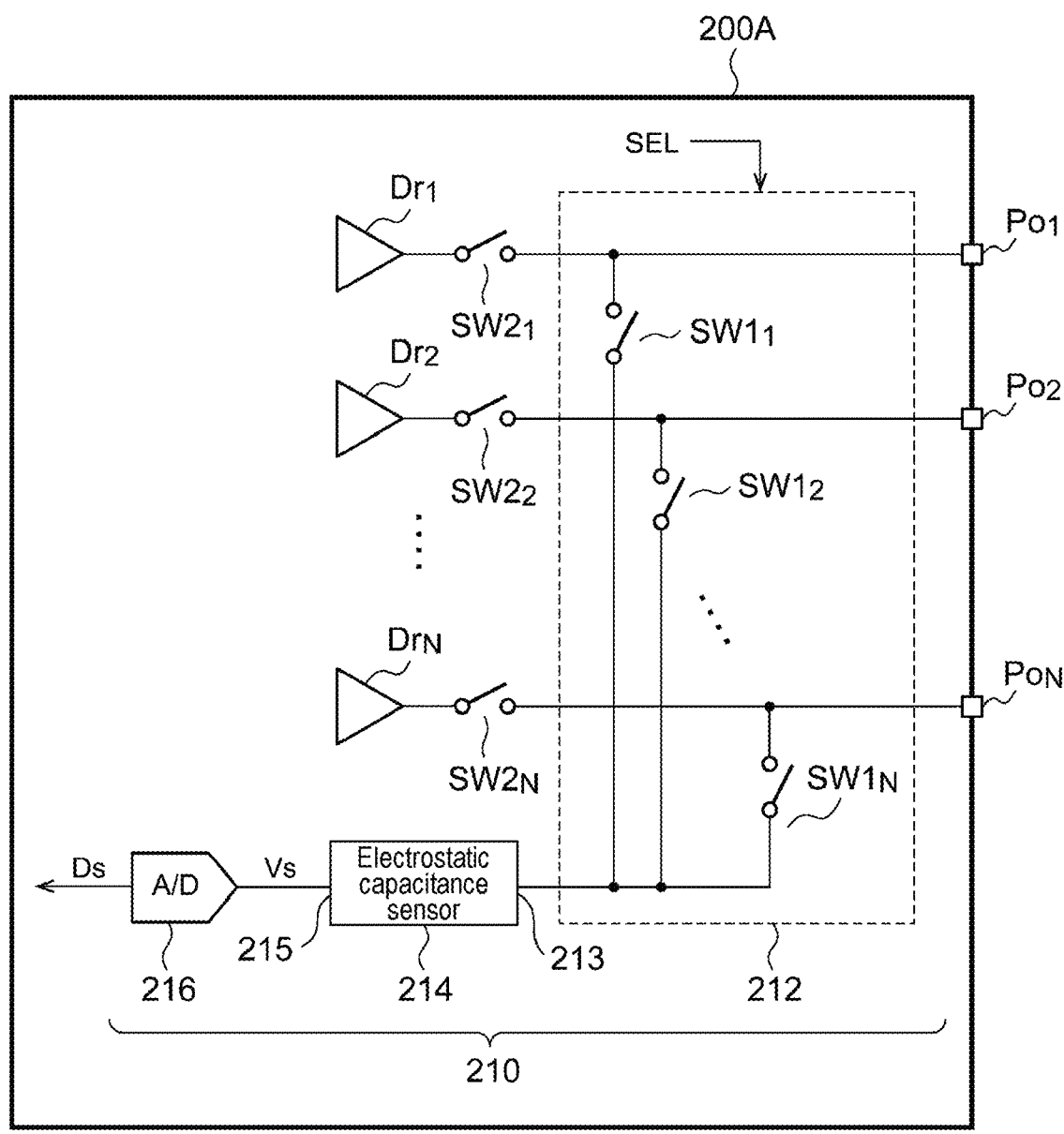
FIG. 9 is a circuit diagram of a driver circuit according to an embodiment of the present disclosure.

FIG. 9 is a circuit diagram of a driver circuit 200A according to an embodiment of the present disclosure. A capacitance detection circuit 210 includes an electrostatic capacitance sensor 212, a selector 214, and an A/D converter 216.

The electrostatic capacitance sensor 212 measures the electrostatic capacitance Cs connected to an input terminal 213, and outputs a detection voltage Vs indicating the electrostatic capacitance Cs from an output terminal 215. The circuit configuration of the electrostatic capacitance sensor 212 is not particularly limited, but may use a known technique. Since the electrostatic capacitance sensor 212 can use the same circuit as that used for a touch panel or an electrostatic capacitance switch, detailed description thereof is omitted here.

When the capacitance detection circuit 210 measures the capacitance, the selector 214 connects the input terminal 213 of the electrostatic capacitance sensor 212 to one of the plurality of output terminals $Po_1$ to $Po_N$ according to a control signal SEL. For example, the selector 214 includes a plurality of first switches $SW1_1$ to $SW1_N$. The A/D converter 216 converts the analog detection voltage Vs into a digital detection signal Ds. By sequentially selecting the plurality of output terminals $Po_1$ to $Po_N$ by the selector 214, detection signals $Ds_1$ to $Ds_N$ indicating the capacitances $Cs_1$ to $Cs_N$ of the plurality of output terminals $Po_1$ to $Po_N$ are outputted from the capacitance detection circuit 210 in a time-division manner.

A plurality of second switches $SW2_1$ to $SW2_N$ are interposed between the outputs of the drivers $Dr_1$ to $Dr_N$ and the output terminals $Po_1$ to $Po_N$. In the normal driving state, the second switches $SW2_1$ to $SW2_N$ are turned on, and are turned off when the capacitance is measured.

Figure 10A:
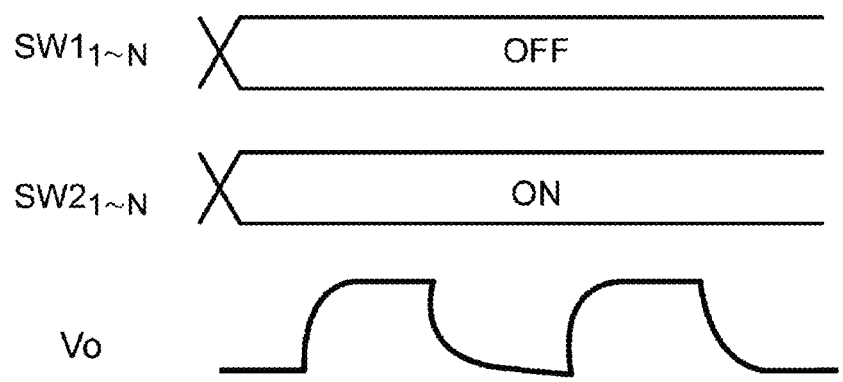
FIG. 10A and FIG. 10B are operation waveform diagrams of the driver circuit of FIG. 9.
Figure 10B:
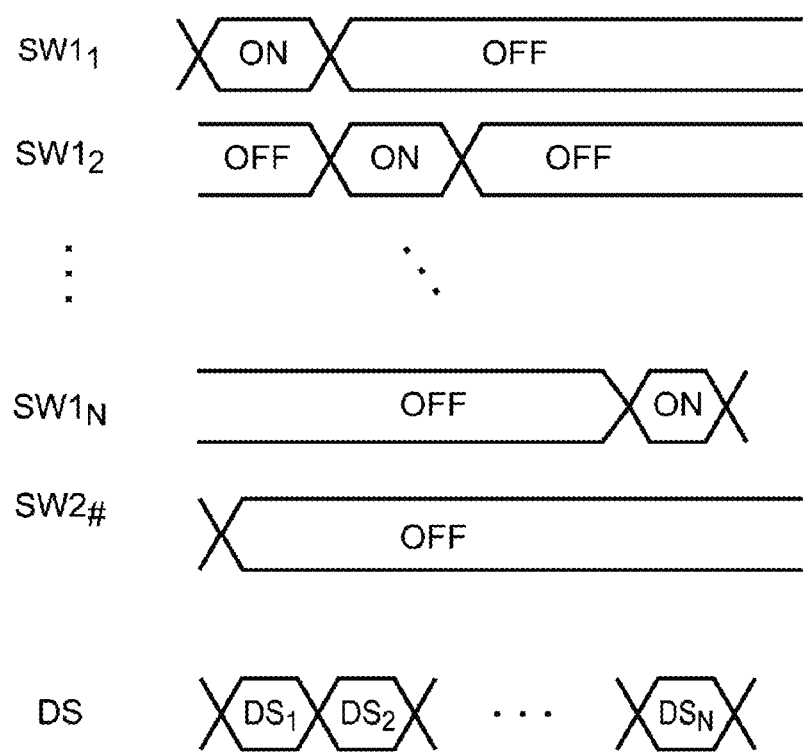

FIG. 10A and FIG. 10B are operation waveform diagrams of the driver circuit 200A shown in FIG. 9. FIG. 10A shows the normal operation. During the normal operation, all of the first switches $SW1_1$ to $SW1_N$ are turned off, all of the second switches $SW2_1$ to $SW2_N$ are turned on, and output voltages $Vo_1$ to $Vo_N$ of the drivers $Dr_1$ to $Dr_N$ are applied to the corresponding load elements.

FIG. 10B shows an abnormality detection based on the capacitance measurement. At the time of capacitance measurement, all of the second switches $SW2_1$ to $SW2_N$ are turned off, the first switches $SW1_1$ to $SW1_N$ are turned on in order, the capacitance Cs of a channel to be turned on is measured, and the detection signals $Ds_1$ to $Ds_N$ are output in a time-division manner.

APPLICABILITY

Figure 11:
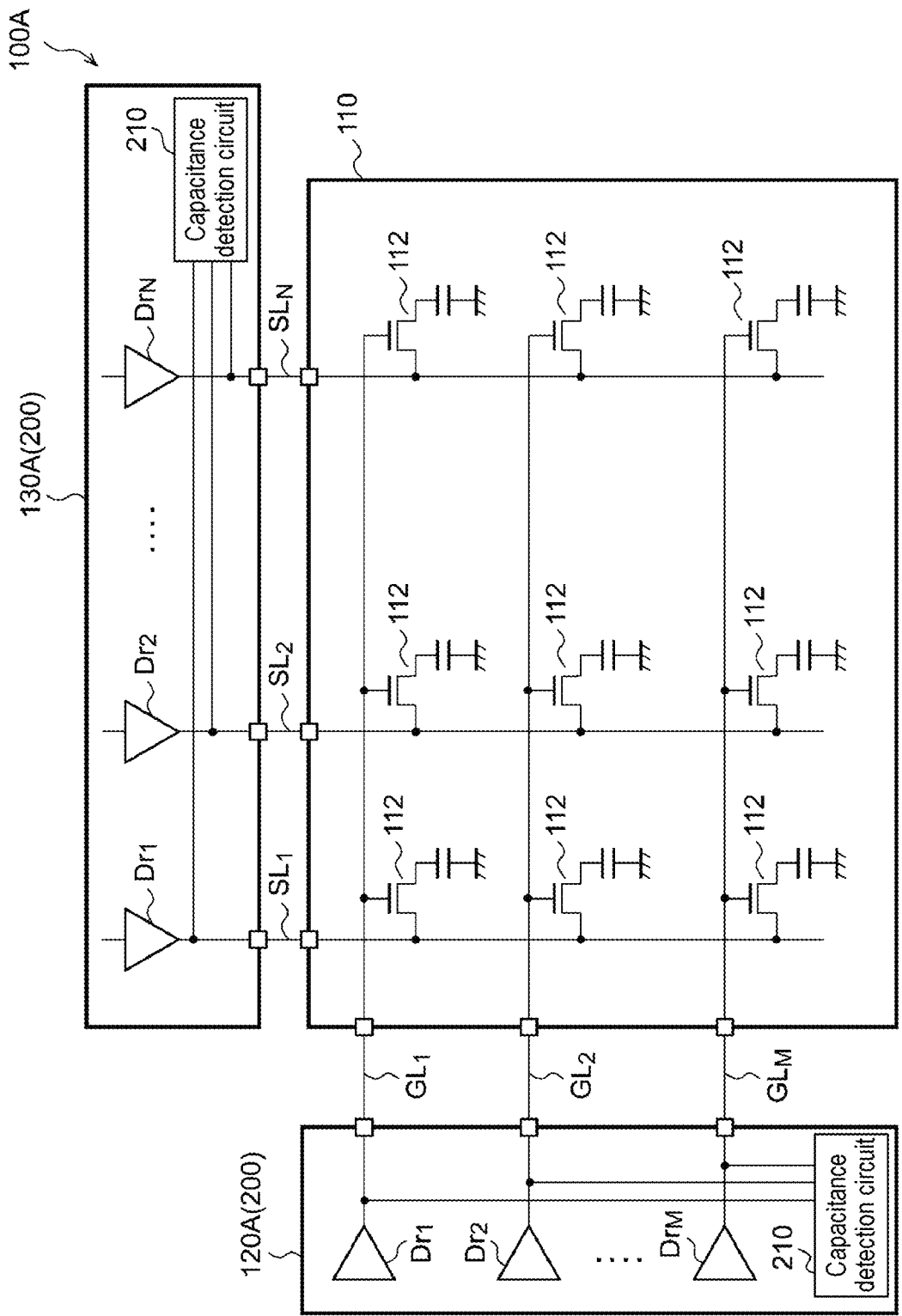
FIG. 11 is a block diagram of a display system according to an embodiment of the present disclosure.

Next, the application of the driver circuit 200 will be described. FIG. 11 is a block diagram of a display system 100A according to an embodiment of the present disclosure. The display system 100A includes a panel 110, a gate driver 120A, and a source driver 130A. The gate driver 120A and the source driver 130A are implemented using the architecture of the driver circuit 200.

The gate driver 120A includes a plurality of drivers $Dr_1$ to $Dr_M$ and a capacitance detection circuit 210. The load element $Z_\#$ of the driver $Dr_\#$ is a plurality of TFTs connected to the corresponding gate line $GL_\#$. The capacitance detection circuit 210 detects the capacitances $Cs_1$ to $Cs_M$ of the load elements $Z_1$ to $Z_M$ connected respectively to the gate lines $GL_1$ to $GL_M$.

The source driver 130A includes a plurality of drivers $Dr_1$ to $Dr_N$ and a capacitance detection circuit 210. The load element $Z_\#$ of the driver $Dr_\#$ is a plurality of TFTs connected to the corresponding source line $SL_\#$. The capacitance detection circuit 210 detects the capacitances $Cs_1$ to $Cs_M$ of the load elements $Z_1$ to $Z_M$ connected respectively to the source lines $SL_1$ to $SL_N$.

The above is the configuration of the display system 100A. By providing the capacitance detection circuit 210 in the gate driver 120A, an abnormality in a gate line can be detected. In addition, by providing the capacitance detection circuit 210 in the source driver 130A, an abnormality in a source line can be detected. Then, by integrating the detection results of the gate driver 120A and the source driver 130A, it is possible to specify a pixel in which an abnormality has occurred. That is, when an abnormality is detected in the channel $CH_i$ in the gate driver 120A and an abnormality is detected in the channel $CH_j$ in the source driver 130A, it can be confirmed that the abnormality has occurred in a pixel in the i-th row and j-th column.

Figure 12:
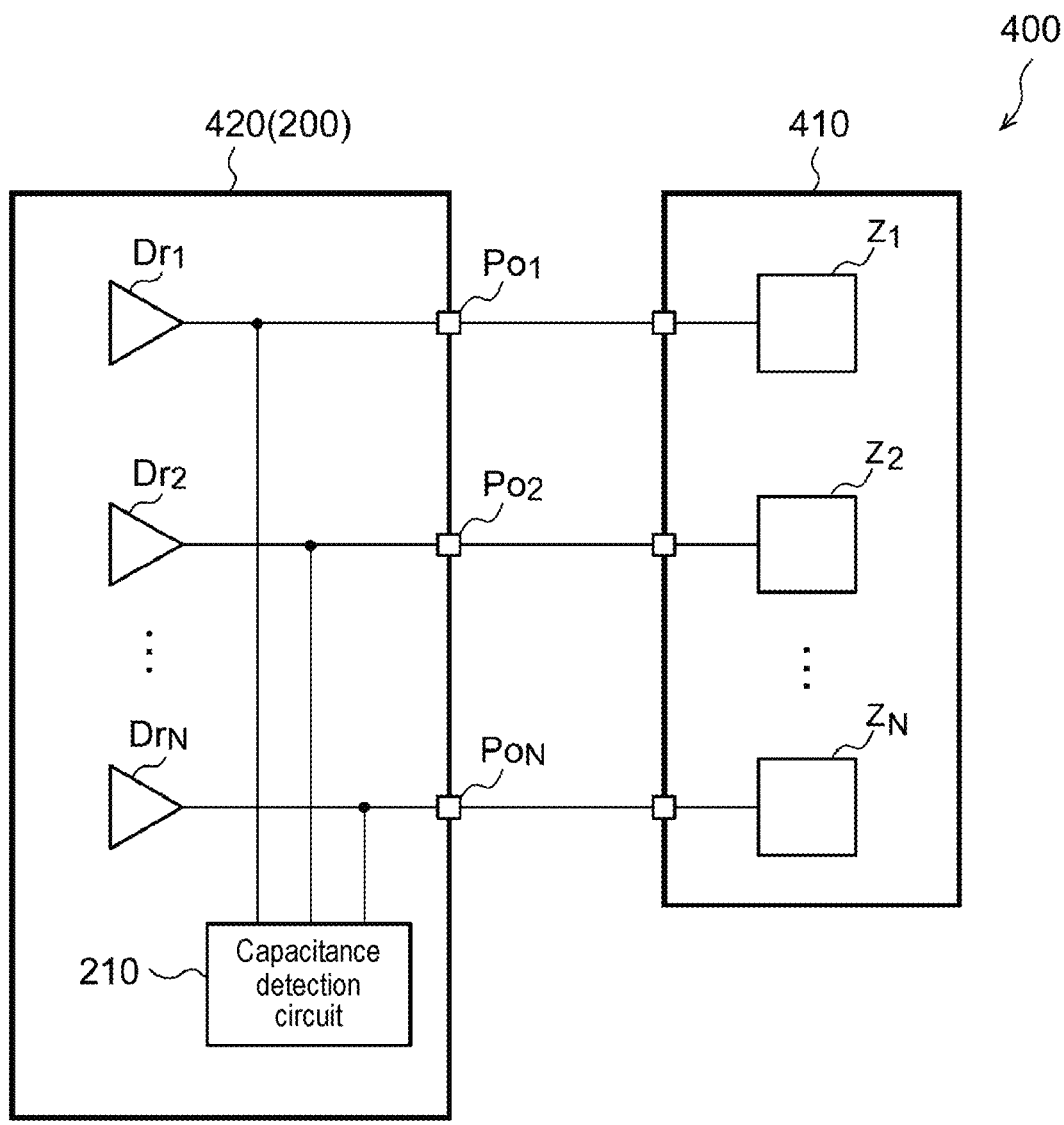
FIG. 12 is a block diagram of a printer system.

FIG. 12 is a block diagram of a printer system 400. The printer system 400 includes a head 410 and a printer driver 420. The head 410 includes a plurality of load elements $Z_1$ to $Z_N$ arranged in an array. The type of a load element depends on the type of a printer. The load element is a piezo element in the case of an ink jet printer, a thermal head (a heater that generates heat by a driving current) in the case of a thermal head printer, and an LED in the case of an LED printer.

The printer driver 420 is configured to be able to drive the load elements, and is constructed using the architecture of the above-described driver circuit 200.

The application of the driver circuit 200 is not limited to a printer and an LCD display. For example, the present disclosure may be applied to a drive circuit for a μLED and an organic EL display, or may be applied to a drive circuit for an actuator of other channels.

The disclosed embodiments are illustrative only. It should be understood by those skilled in the art that various modifications to combinations of elements or processes may be made and such modifications fall within the scope of the present disclosure.

First Modification

In the embodiment, an abnormality is detected in the driver circuit 200 by the signal processing of the signal processing part 220, but the present disclosure is not limited thereto. The signal processing for detecting the abnormality may be performed by the host processor 320. In a first modification, the capacitances $Cs_1$ to $Cs_N$ measured by the capacitance detection circuit 210 may be delivered to the host processor 320 via the interface circuit 230, and the host processor 320 may determine whether or not there is an abnormality (or an abnormal mode).

The voltage output type driver circuit has been described in the embodiment of the present disclosure. However, the present disclosure is not limited thereto and may be applied to a current output type driver circuit. For example, when a load to be driven is an LED or a thermal head, the driver circuit includes a current sink type (or current source type) driver Dr.

According to the present disclosure in some embodiments, it is possible to detect load abnormality and deterioration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A driver circuit that drives a plurality of capacitive loads, comprising:
   a plurality of output terminals to which the plurality of capacitive loads are to be connected;
      a plurality of drivers that corresponds to the plurality of output terminals, respectively, and is configured to generate drive signals to be applied to the plurality of capacitive loads, respectively;
      a capacitance detection circuit configured to detect a plurality of capacitances associated with the plurality of output terminals, respectively; and
   a signal processing part configured to detect abnormality based on the plurality of capacitances associated with the plurality of output terminals,
   wherein if the signal processing part detects an abnormality that a capacitance of a first capacitive load among the plurality of capacitive loads, which is associated with a first driver among the plurality of drivers, increases, the first driver is configured to adjust a driving capability of the first driver to increase according to a degree of increase of the capacitance of the first capacitive load,
   wherein if the signal processing part detects an abnormality that the capacitance of the first capacitive load decreases, the first driver is configured to adjust the driving capability of the first driver to decrease according to a degree of decrease of the capacitance of the first capacitive load,
   wherein the capacitance detection circuit is configured to be turned off while the driver circuit drives the plurality of capacitive loads, and to be turned on immediately after the driver circuit is started, and
   wherein outputs of the plurality of drivers are set to a high impedance state while the capacitance detection circuit is in an ON state.

2. The driver circuit of claim 1, wherein the capacitance detection circuit includes:
   an electrostatic capacitance sensor; and
   a selector configured to connect the electrostatic capacitance sensor to one of the plurality of output terminals according to a control signal.

3. The driver circuit of claim 1, further comprising: a plurality of switches corresponding to the plurality of output terminals and installed between outputs of the drivers respectively corresponding to the switches and the output terminals respectively corresponding to the switches.

4. The driver circuit of claim 1, wherein the signal processing part is further configured to monitor an aging change of each of the plurality of capacitances associated with the plurality of output terminals, respectively.

5. The driver circuit of claim 1, wherein the signal processing part is further configured to detect a degree of deterioration or abnormality based on an aging change of the plurality of capacitances associated with the plurality of output terminals, respectively.

6. The driver circuit of claim 1, wherein the signal processing part is further configured to detect abnormality based on a relative relationship between the plurality of capacitances respectively associated with the plurality of output terminals.

7. The driver circuit of claim 6, wherein the signal processing part is further configured to determine that a first abnormality has occurred in a first output terminal among the plurality of output terminals when a capacitance associated with the first output terminal is larger than a capacitance associated with another output terminal among the plurality of output terminals.

8. The driver circuit of claim 6, wherein the signal processing part is further configured to determine that a second abnormality has occurred in second output terminals, which are adjacent to each other, among the plurality of output terminals when capacitances associated with the second output terminals are larger than a capacitance associated with another output terminal among the plurality of output terminals.

9. The driver circuit of claim 6, wherein the signal processing part is further configured to determine that a third abnormality has occurred in a third output terminal among the plurality of output terminals when the third output terminal is detected to be in an open state according to a capacitance associated with the third output terminal.

10. The driver circuit of claim 1, wherein the driver circuit is configured to be capable of notifying a degree of deterioration or an abnormality to outside of the driver circuit.

11. The driver circuit of claim 1, wherein the driver circuit is configured to drive a matrix type display panel.

12. The driver circuit of claim 1, wherein the driver circuit is configured to drive a printer head.

* * * * *